(12) United States Patent
Hsu et al.

(10) Patent No.: US 11,616,135 B2
(45) Date of Patent: Mar. 28, 2023

(54) HIGH ELECTRON MOBILITY TRANSISTOR AND METHOD OF FORMING THE SAME

(71) Applicant: UNITED MICROELECTRONICS CORP., Hsin-Chu (TW)

(72) Inventors: Yu-Ming Hsu, Changhua County (TW); Yen-Hsing Chen, Taipei (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 58 days.

(21) Appl. No.: 16/843,851

(22) Filed: Apr. 8, 2020

(65) Prior Publication Data
US 2021/0249528 A1 Aug. 12, 2021

(30) Foreign Application Priority Data
Feb. 6, 2020 (CN) .......................... 202010081665.5

(51) Int. Cl.
| | |
|---|---|
| *H01L 29/66* | (2006.01) |
| *H01L 29/778* | (2006.01) |
| *H01L 29/16* | (2006.01) |
| *H01L 29/20* | (2006.01) |

(52) U.S. Cl.
CPC ...... *H01L 29/7785* (2013.01); *H01L 29/1608* (2013.01); *H01L 29/2003* (2013.01); *H01L 29/66431* (2013.01)

(58) Field of Classification Search
CPC combination set(s) only.
See application file for complete search history.

(56) References Cited

U.S. PATENT DOCUMENTS

| | | | |
|---|---|---|---|
| 7,638,819 B2 | 12/2009 | Kikkawa et al. | |
| 8,404,508 B2 | 3/2013 | Lidow et al. | |
| 2008/0079023 A1* | 4/2008 | Hikita | H01L 29/66462 257/E29.252 |
| 2014/0091315 A1 | 4/2014 | Yamada | |
| 2014/0183545 A1 | 7/2014 | Hoke | |
| 2015/0041825 A1* | 2/2015 | Liu | H01L 29/7783 257/190 |
| 2016/0240679 A1 | 8/2016 | Chen | |
| 2018/0026124 A1* | 1/2018 | Shimizu | H01L 29/513 257/76 |
| 2018/0145148 A1* | 5/2018 | Yamada | H01L 29/66431 |
| 2019/0148485 A1* | 5/2019 | Hamada | H01L 29/0696 257/493 |

\* cited by examiner

*Primary Examiner* — Moin M Rahman
(74) *Attorney, Agent, or Firm* — Winston Hsu

(57) ABSTRACT

A high electron mobility transistor (HEMT) includes a substrate, a P-type III-V composition layer, a gate electrode and a carbon containing layer. The P-type III-V composition layer is disposed on the substrate, and the gate electrode is disposed on the P-type III-V composition layer. The carbon containing layer is disposed under the P-type III-V composition layer to function like an out diffusion barrier for preventing from the dopant within the P-type III-V composition layer diffusing into the stacked layers underneath during the annealing process.

8 Claims, 5 Drawing Sheets

HIGH ELECTRON MOBILITY TRANSISTOR AND METHOD OF FORMING THE SAME

BACKGROUND OF THE INVENTION

1. Field of the Invention

The present invention relates to a high electron mobility transistor (HEMT), and more particularly, to a high electron mobility transistor having an additional carbon containing layer for blocking dopant diffusion.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the two-dimensional electron gas.

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices. However, with the upgrading of electronic products, the structure and fabrication of the high electron mobility transistors need to be further improved to meet the industrial requirements to gain diverse functionality.

SUMMARY OF THE INVENTION

One of the objectives of the present invention provides a high electron mobility transistor (HEMT) and a method of forming the same. The high electron mobility transistor includes an additional out diffusion barrier which may prevent from the dopant within the P-type III-V composition layer diffusing into the stacked layers underneath during the annealing process, thereby avoiding the electrical properties of the high electron mobility transistor being affected by diffused dopants.

To achieve the purpose described above, one embodiment of the present invention provides a high electron mobility transistor, and the high electron mobility transistor includes a substrate, a P-type III-V composition layer, a gate electrode, and a carbon containing layer. The P-type III-V composition layer is disposed on the substrate. The gate electrode is disposed on the P-type III-V composition layer, and the carbon containing layer is disposed under the P-type III-V composition layer.

To achieve the purpose described above, another embodiment of the present invention provides a method of forming high electron mobility transistor, and the method includes the following steps. Firstly, a substrate is provided. Next, a P-type III-V composition layer is formed on the substrate, and a gate electrode is formed on the P-type III-V composition layer. Then, a carbon containing layer is formed under the P-type III-V composition layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
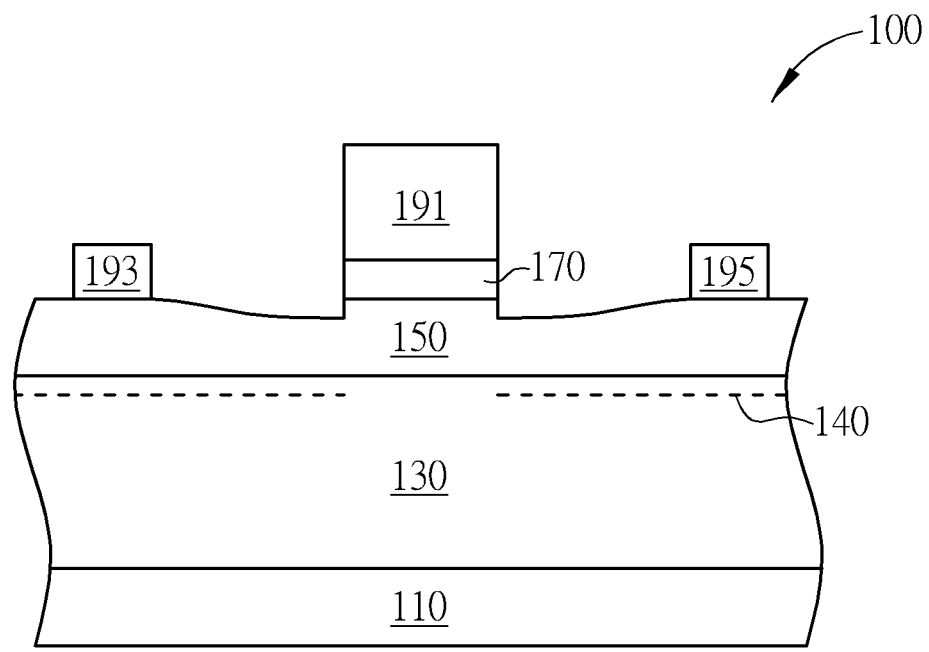
FIG. 1 is a schematic diagram illustrating a cross-sectional view of a high electron mobility transistor according to one embodiment in the present invention.

Please refer to FIG. 1, which illustrates a cross-sectional view of a high electron mobility transistor according to one embodiment of the present invention. As shown in FIG. 1, a high electron mobility transistor 100 includes a substrate 110, and the substrate 110 may be formed by silicon or other semiconductor material. In one embodiment, the substrate 110 may include a silicon layer with <111> lattice structure, but not limited thereto. In another embodiment, the substrate 110 may also include a semiconductor compound such as silicon carbide (SiC), gallium arsenide (GaAs), indium arsenide (InAs) or indium phosphide (InP), or a semiconductor alloy such as silicon germanium (SiGe), silicon germanium carbide (SiGeC), gallium arsenide phosphide (AsGaP) or indium gallium phosphide (InGaP). Then, a channel layer 130 and a barrier layer 150 are sequentially formed on the substrate 110. The channel layer 130 and the barrier layer 150 may respectively include different III-V materials, so that, a heterojunction is formed between the channel layer 130 and the barrier layer 150, thereby leading to discontinuous band-gaps. In the present embodiment, the barrier layer 150 may include aluminum gallium nitride ($Al_{x1}Ga_{1-x1}N$, with $_{x1}$ being a constant greater than 0 and less than 1), the channel layer 130 may include gallium nitride (GaN), and the band-gap of the barrier layer 150 is greater than the band-gap of the channel layer 130. Accordingly, the electron of the barrier layer 150 generated by the piezoelectricity may fall in the channel layer 130, thereby forming a high mobility electron film namely a two-dimensional electron gas (2DEG) 140 within the channel layer 130 and adjacent to the barrier layer 150, as shown in FIG. 1. In one embodiment, a buffer layer (not shown in the drawings) may further be formed under the channel layer 130, and the buffer layer may include the same material as the channel layer 130, such as gallium nitride.

Furthermore, a P-type III-V composition layer 170 is formed on the barrier layer 150, a gate electrode 191 is formed on the P-type III-V composition layer 170, and a source electrode 193 and a drain electrode 195 are formed on the barrier layer 150, at two sides of the P-type III-V composition layer 170 and the gate electrode 191, respectively. The P-type III-V composition layer 170 is only disposed right below the gate electrode 191, so that, sidewalls of the P-type III-V composition layer 170 are vertical aligned with two sidewalls of the gate electrode 191, as shown in FIG. 1. The P-type III-V composition layer 170 may include a divalent dopant, such as magnesium (Mg), zinc (Zn), calcium (Ca), beryllium (Be) or iron (Fe). The divalent dopant may occupy the original space of the III-V compound within a portion of the channel layer 130 which is right below the gate electrode 191, depleting the two-dimensional electron gas 140 to form a normally off channel. Accordingly, the high electron mobility transistor 100 of the present embodiment may also become a normally off device. In the present embodiment, the P-type III-V composition layer 170 includes but not limited to P-type doped gallium nitride (pGaN), and the divalent dopant preferably includes magnesium. In another embodiment, the P-type III-V composition layer 170 may also include P-type doped aluminum gallium nitride (pAlGaN) or P-type doped indium gallium nitride (p-InGaN), or includes a multilayer structure. The gate electrode 191, source electrode 193 and the drain electrode 195 may include titanium (Ti), aluminum (Al), titanium nitride (TiN), or other suitable conductive materials.

In the present embodiment, each stacked layer (including the channel layer 130, the barrier layer 150 and the P-type III-V composition layer 170) of the high electron mobility transistor 100 may also be formed through an epitaxial process, such as a metal organic chemical vapor deposition (MOCVD) process, a molecular beam epitaxy (MBE) process, or a hydride vapor phase epitaxy (HVPE) process, but not limited thereto. While forming the P-type III-V composition layer 170, a P-type III-V material layer (not shown in the drawings) is firstly formed to cover the entire surfaces of the barrier layer 150, and an etching process is performed to remove the P-type III-V material layer outside the coverage of the gate electrode 191, thereby forming the P-type III-V composition layer 170. Also, an annealing process may be performed after implanting the divalent dopant into the P-type III-V composition layer 170, so that, the divalent dopant may be uniformly diffused in the P-type III-V composition layer 170.

However, since the material of the P-type III-V material layer is similar to the material of the barrier layer 150 underneath, it is difficult to adjust the etching selectivity of the etching process. Then, a portion of the P-type III-V material layer which is closed to the gate electrode 191 may be etched rapidly, and a portion of the P-type III-V material layer which is away from the gate electrode 191 may be etched slowly. With such etching performance, a portion of the barrier layer 150, such as the portion of the barrier layer 150 closed to the gate electrode 191, may also be removed while the P-type III-V material layer outside the coverage of the gate electrode 191 are requested to be completely removed. Then, a recess as shown in FIG. 1 may be formed on the barrier layer 150. The recess of the barrier layer 150 may affect the overall electrical property of the high electron mobility transistor 100. On the other hand, the divalent dopant within the P-type III-V composition layer 170 may be further diffused into the stacked layers such as the barrier layer 150 or the channel layer 130 underneath, thereby also affecting the overall electrical property of the high electron mobility transistor 100.

Thus, people well known in the arts should easily realize the high electron mobility transistor and the forming method thereof in the present invention is not limited to the aforementioned embodiment, and may further include other examples or variety. The following description will detail the different embodiments of the high electron mobility transistor and the forming method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
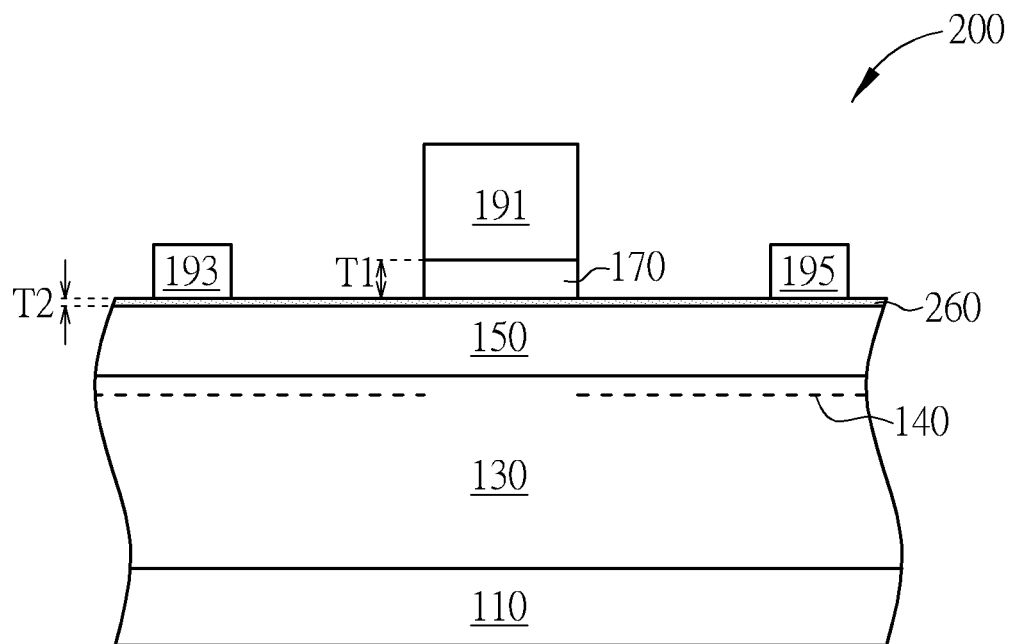
FIG. 2 is a schematic diagram illustrating a cross-sectional view of a high electron mobility transistor according to another embodiment in the present invention.

Please refer to FIG. 2, which illustrates a cross-sectional view of a high electron mobility transistor 200 according to another embodiment of the present invention. The structure of the high electron mobility transistor 200 is substantially similar to that in the aforementioned embodiment as shown in FIG. 1, and which also includes the substrate 110, the channel layer 130, the barrier layer 150, the two-dimensional electron gas 140, the P-type III-V composition layer 170, the gate electrode 191, the source electrode 193 and the drain electrode 195. All similarity between the present embodiment and the aforementioned embodiment will not be redundant described hereinafter. The difference between the present embodiment and the aforementioned embodiment is in that a carbon containing layer 260 is additionally disposed, with the carbon containing layer 260 being used as an etching stop layer while etching the P-type III-V material layer, to avoid the barrier layer 150 underneath being etched, and with the carbon containing layer 260 also being used as an out diffusion barrier, to prevent from the divalent dopant diffusing into the stacked layers (such as the barrier layer 150 or the channel layer 130) underneath.

Precisely speaking, the carbon containing layer 260 is for example disposed between the P-type III-V composition layer 170 and the channel layer 130, preferably disposed on the barrier layer 150. In other words, the P-type III-V composition layer 170 of the present embodiment is disposed on the carbon containing layer 260, and the source electrode 193 and the drain electrode 195 are disposed on the carbon containing layer 260, also at two sides of the gate electrode 191, as shown in FIG. 2. It is noted that, the carbon containing layer 260 may include any suitable material containing carbon elements or doped with carbon atoms, for example silicon carbide (SiC) or carbon doped III-V compounds, with the doped concentration of carbon thereof being about 1E15 to 1E21 in per cubic centimeter (1E15-1E21/cm$^3$). In the present embodiment, the carbon containing layer 260 includes but not limited to carbon doped III-V compound, such as carbon doped gallium nitride (C:GaN), carbon doped aluminum gallium nitride (C:AlGaN), carbon doped silicon (C:Si), or carbon doped boron nitride (C:BN), and the carbon doping method is but not limited to an in-situ doping during the epitaxial process or an additional doping after the epitaxial process. In one embodiment, the material of the carbon containing layer 260 may be further adjustable based on the material of the P-type III-V composition layer 170 disposed above. For example, while the P-type III-V composition layer 170 includes but not limited to P-type gallium nitride (pGaN), the carbon containing layer 260 underneath preferably includes carbon doped gallium nitride, but not limited thereto; while the P-type III-V composition layer 170 includes but not limited to P-type aluminum gallium nitride (pAlGaN), the carbon containing layer 260 underneath preferably includes carbon doped aluminum gallium nitride, but not limited thereto. Furthermore, in the carbon containing layer 260 of the present embodiment, the overall carbon concentration in the carbon doped III-V compound may be 1E15 to 1E21 in per cubic centimeter (1E15-1E21/cm$^3$), preferably between 1E18 and 1E20 in per cubic centimeter (1E18-1E20/cm$^3$), to reach the lowest carbon concentration which is enable to block the divalent dopant of the P-type III-V composition layer 170 diffusing downwardly.

It is also noted that, the carbon containing layer 260 has a relative smaller thickness in comparison with other stacked layers (including the channel layer 130, the barrier layer 150 and the P-type III-V composition layer 170), to avoid the distances between the P-type III-V composition layer 170 and the two-dimensional electron gas 140 being excessively increased, and to prevent from the depletion of the P-type III-V composition layer 170 on the two-dimensional electron gas 140 being affected thereby. In one embodiment, a thickness T2 of the carbon containing layer 260 is for example about 1/100 to 1/10 of a thickness T1 of the P-type III-V composition layer 170. For example, the thickness T1 of the P-type III-V composition layer 170 may be about 60 to 80 nanometers (nm), and the thickness T2 of the carbon containing layer 260 may be about 1 to 5 nanometers, preferably to 1 to 2 nanometers, but not limited thereto.

Through these arrangements, the carbon containing layer 260 additional disposed in the present embodiment may function like an out diffusion barrier to prevent from the divalent dopant within the P-type III-V composition layer 170 diffusing into the stacked layers underneath during the annealing process. Also, due to the relative greater etching selectivity between the carbon containing layer 260 and the barrier layer 150 underneath, the carbon containing layer 260 may also function like an etching stop layer during etching the P-type III-V material layer, to prevent from the barrier layer 150 being etched to form the recess while etching the P-type III-V material layer. Accordingly, the high electron mobility transistor 200 of the present embodiment may obtain completed elements to perform better function.

Figure 3:
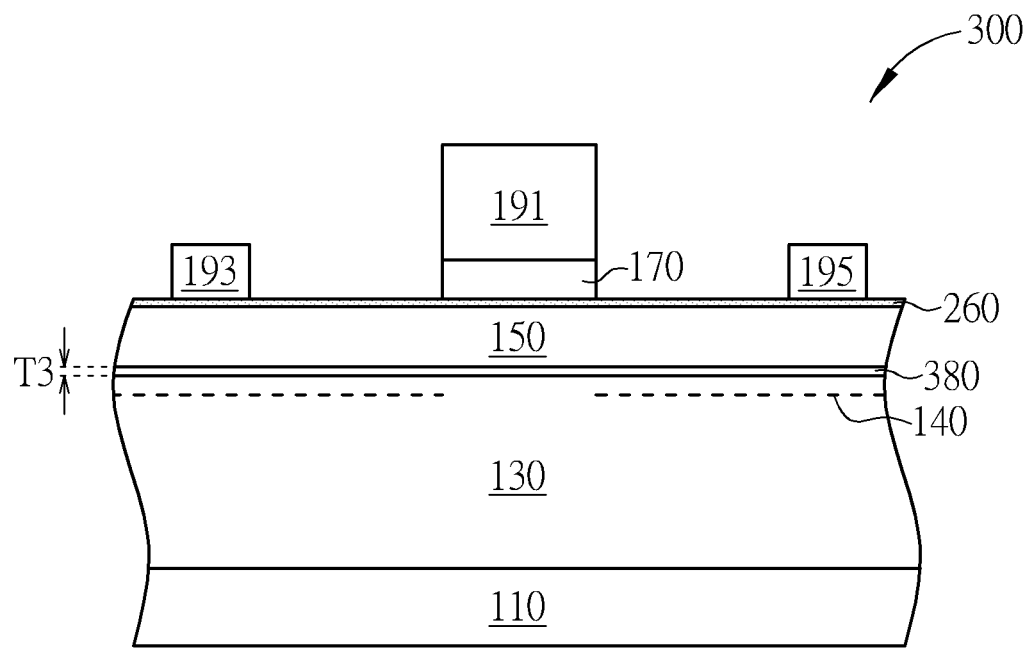
FIG. 3 is a schematic diagram illustrating a cross-sectional view of a high electron mobility transistor according to another embodiment in the present invention.

Please refer to FIG. 3, which illustrates a cross-sectional view of a high electron mobility transistor 300 according to another embodiment of the present invention. The structure of the high electron mobility transistor 300 is substantially similar to that of the aforementioned embodiment as shown in FIG. 2, and the similarity therebetween will not be redundant described hereinafter. The difference between the present embodiment and the aforementioned embodiment is mainly in that a spacer layer 380 is further disposed between the barrier layer 150 and the channel layer 130.

Precisely, the spacer layer 380 may also include a III-V material, preferably being different from that of the barrier layer 150, so that, the band gap of the barrier layer 150 may be different from that of the channel layer 130 as much as possible, thereby generating a relative larger amount of electrons to improve the electrical property of the high electron mobility transistor 300. In the present embodiment, the barrier layer 150 may include aluminum gallium nitride ($Al_{x2}Ga_{1-x2}N$, with $_{x2}$ being a constant greater than or equal to 0 and less than 1), and the spacer layer 380 includes but not limited to aluminum nitride (AlN). Also, the spacer layer 380 preferably includes a relative smaller thickness T3, for example being bout 1 to 5 nanometers, preferably being about 1 to 2 nanometers, for prevent from the depletion of the P-type III-V composition layer 170 on the two-dimensional electron gas 140 being affected thereby.

Through these arrangements, the spacer layer 380 disposed between the barrier layer 150 and the channel layer 130 in the high electron mobility transistor 300 of the present embodiment may generate greater amount of electrons, to further improve the electrical property of the high electron mobility transistor 300.

Figure 4:
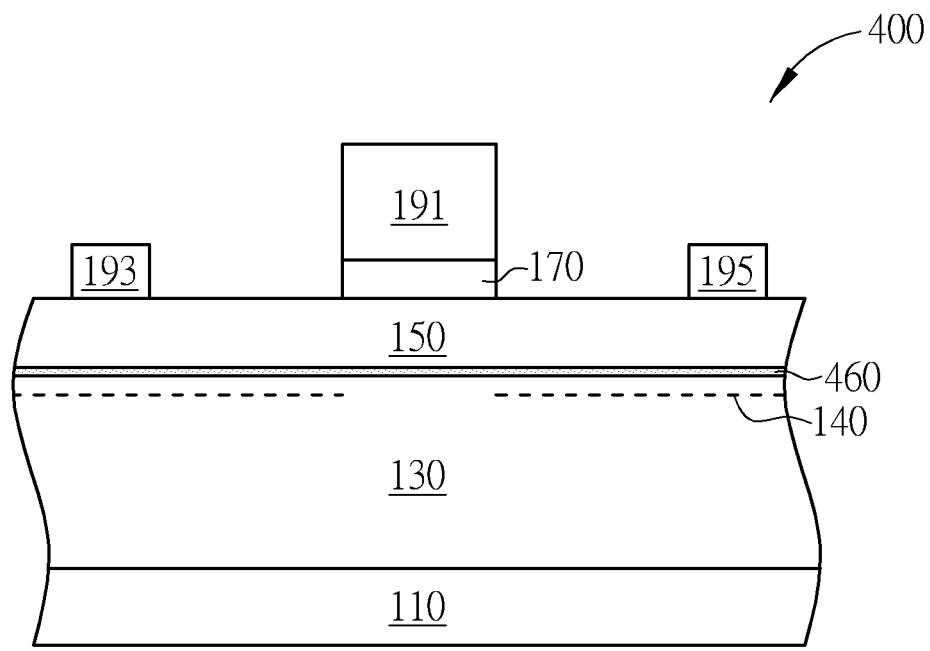
FIGS. 4-6 are schematic diagrams illustrating a cross-sectional view of a high electron mobility transistor according to another embodiment in the present invention.
Figure 5:
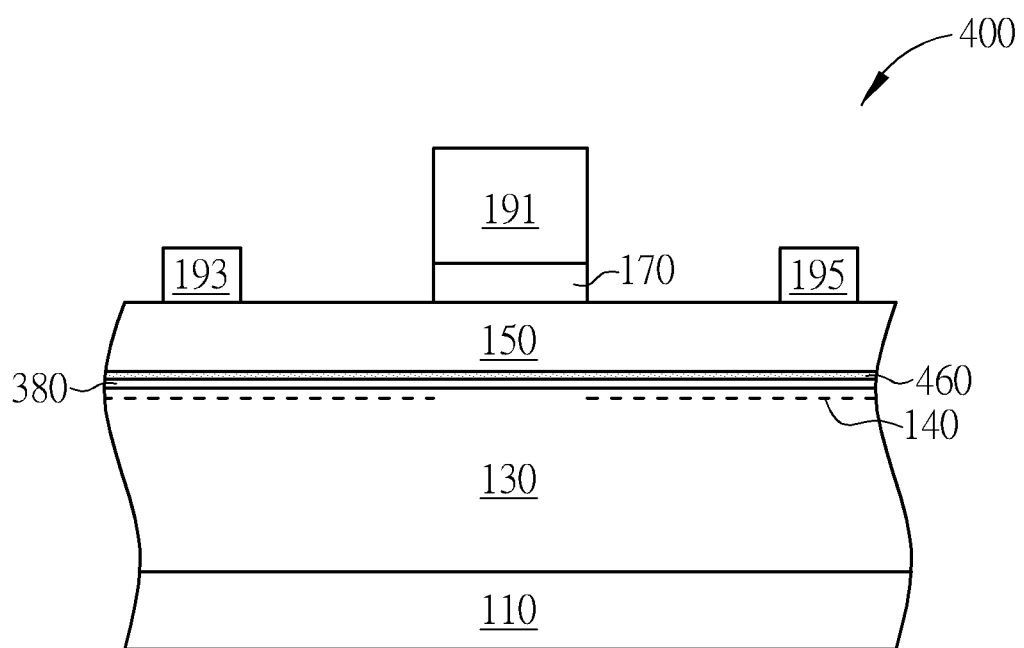
Figure 6:
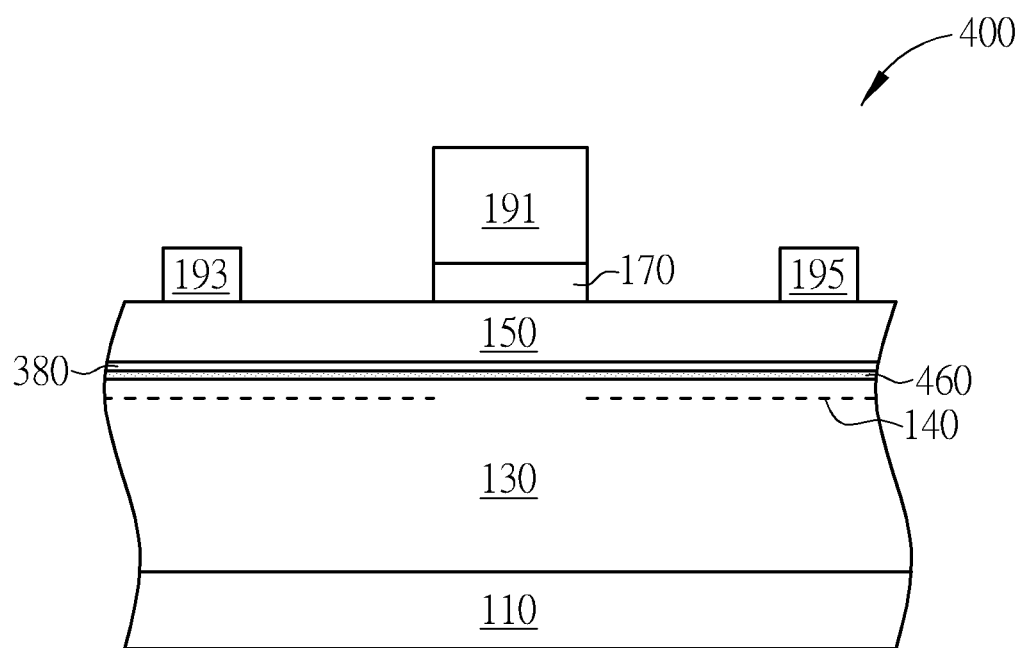

Please refer to FIG. 4 to FIG. 6, which illustrate a cross-sectional view of a high electron mobility transistor 400 according to another embodiment of the present invention. The structure of the high electron mobility transistor 400 is substantially similar to that of the aforementioned embodiment as shown in FIG. 2, and the similarity therebetween will not be redundant described hereinafter. The difference between the present embodiment and the aforementioned embodiment is mainly in that, the position of a carbon containing layer 460 may be further adjusted according to the practical requirements of products, so as to meet the depth of the diffused dopant which is requested to be blocked.

As shown in FIG. 4, the carbon containing layer 460 may be optionally disposed under the barrier layer 150, between the P-type III-V composition layer 170 and the channel layer 130. The carbon containing layer 460 may include any suitable material containing carbon elements or doped with carbon atoms, for example silicon carbide or carbon doped III-V compounds, with the carbon doped III-V compounds including but not limited to carbon doped gallium nitride, carbon doped aluminum gallium nitride, carbon doped silicon, or carbon doped boron nitride. In a preferably embodiment, the P-type III-V composition layer 170 may include but not limited to P-type aluminum gallium nitride ($Al_{x3}Ga_{1-x3}N$), the barrier layer 150 includes aluminum gallium nitride ($Al_{x4}Ga_{1-x4}N$), and the carbon containing layer 460 includes carbon doped aluminum gallium nitride ($Al_{x5}Ga_{1-x5}N$), with all of $_{x3}$, $_{x4}$, $_{x5}$ being a constant greater than 0, and being between 0.1 and 0.5. In one embodiment, $_{x5}$ is greater than $_{x4}$ and $_{x4}$ is greater than $_{x3}$ ($_{x5}>_{x4}>_{x3}$), and in another embodiment, $_{x4}$ is greater than $_{x3}$ and $_{x4}$ is greater than $_{x5}$ ($_{x4}>_{x5}$, $_{x4}>_{x3}$), or $_{x3}$ is greater than $_{x4}$ and $_{x4}$ is greater than $_{x5}$ ($_{x3}>_{x4}>_{x5}$). For example, the P-type III-V composition layer 170 may include P-type aluminum gallium nitride ($Al_{0.1}Ga_{0.9}N$), the barrier layer 150 includes aluminum gallium nitride ($Al_{0.2}Ga_{0.8}N$), and the carbon containing layer 460 includes carbon doped aluminum gallium nitride ($C:Al_{0.3}Ga_{0.7}N$), or the P-type III-V composition layer 170 may include P-type aluminum gallium nitride ($Al_{0.1}Ga_{0.9}N$), the barrier layer 150 includes aluminum gallium nitride ($Al_{0.3}Ga_{0.7}N$), and the carbon containing layer 460 includes carbon doped aluminum gallium nitride ($C:Al_{0.2}Ga_{0.8}N$), or the P-type III-V composition layer 170 may include P-type aluminum gallium nitride ($Al_{0.3}Ga_{0.7}N$), the barrier layer 150 includes aluminum gallium nitride ($Al_{0.2}Ga_{0.8}N$), and the carbon containing layer 460 includes carbon doped aluminum gallium nitride ($C:Al_{0.1}Ga_{0.9}N$), but is not limited thereto. Furthermore, the thickness (thickness T2) and other features of the carbon containing layer 460 are substantially similar to those of the carbon containing layer 260, and will not be redundantly described hereinafter.

Though these arrangements, the carbon containing layer 460 of the present embodiment is functioned like an out diffusion barrier to prevent from the divalent dopant within the P-type III-V composition layer 170 diffusing into the channel layer 130 underneath during the annealing process. In comparison with the carbon containing layer 260 in the aforementioned embodiment, the carbon containing layer 460 is disposed at a relative deeper position for blocking any possible dopant diffused from the P-type III-V composition layer 170, so as to improve the electrical property of the high electron mobility transistor 400. However, people well known in the arts should easily realize that the position of the carbon containing layer is not limited to be disposed either on the barrier layer 150 or under the barrier layer 150, and which may be disposed at any other suitable positions based the practical product requirements in another embodiment, to form an out diffusion barrier at various suitable depths. As an example, in the embodiment of having the spacer layer 380 under the barrier layer 150, the carbon containing layer 460 may be optionally disposed on the spacer layer 380, between the spacer layer 380 and the barrier layer 150, as shown in FIG. 5, or disposed under the barrier layer 150 and the spacer layer 380, as shown in FIG. 6, thereby also functioning like an out diffusion barrier at a relative greater depth to prevent from any possible dopants diffused from the P-type III-V composition layer 170.

Figure 7:
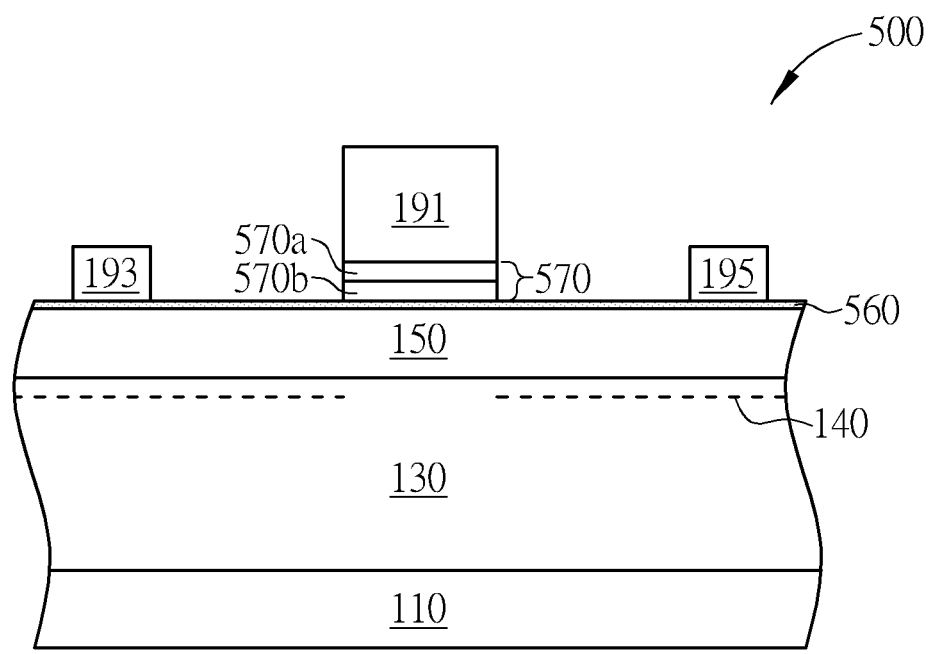
FIGS. 7-8 are schematic diagrams illustrating a cross-sectional view of a high electron mobility transistor according to another embodiment in the present invention.
Figure 8:
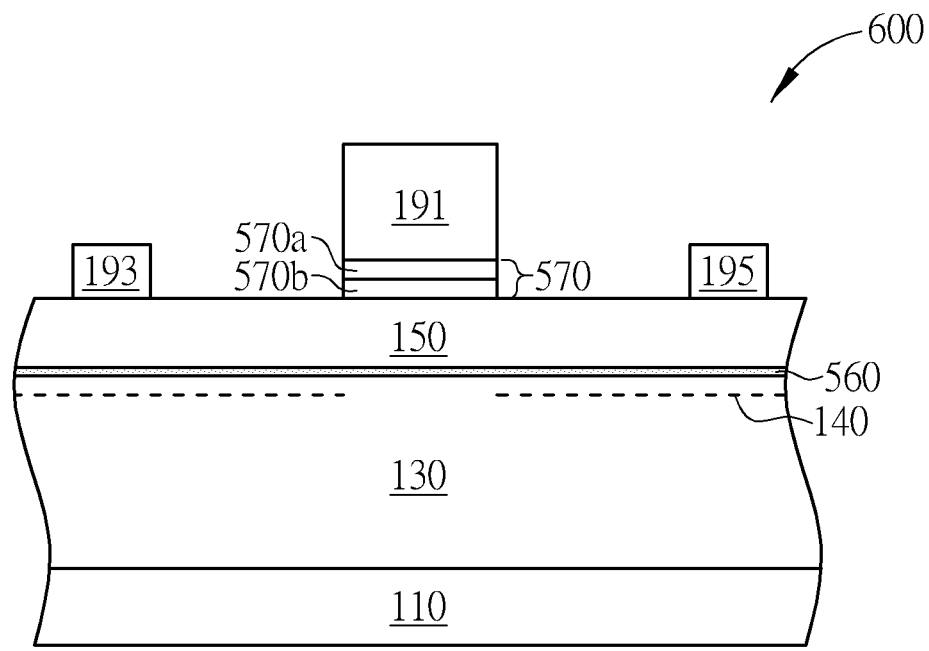

Please refer to FIG. 7 to FIG. 8, which illustrate a cross-sectional view of a high electron mobility transistor 500, 600 according to another embodiment of the present invention. The structure of the high electron mobility transistor 500, 600 is substantially similar to that of the aforementioned embodiments, and the similarity therebetween will not be redundant described hereinafter. The difference between the present embodiment and the aforementioned embodiment is mainly in that the P-type III-V composition layer 570 includes a multilayer structure.

Precisely, as shown in FIG. 7 and FIG. 8, the P-type III-V composition layer 570 includes a first P-type III-V composition layer 570a and a second P-type III-V composition layer 570b stacked from top to bottom, and the first P-type III-V composition layer 570a and the second P-type III-V composition layer 570b preferably include different materials. In the present embodiment, the first P-type III-V composition layer 570a includes but not limited to pGaN, and the second P-type III-V composition layer 570b includes but not limited to P-type aluminum gallium nitride ($Al_{x3}Ga_{1-x3}N$). The carbon containing layer 560 may also be disposed between the P-type III-V composition layer 570 and the channel layer 130, either on the barrier layer 150 as shown in FIG. 7, or under the barrier layer 150 as shown in FIG. 8. The carbon containing layer 560 may include any suitable material containing carbon elements or doped with carbon atoms, for example silicon carbide or carbon doped III-V compounds, with the carbon doped III-V compounds including but not limited to carbon doped gallium nitride, carbon doped aluminum gallium nitride, carbon doped silicon, or carbon doped boron nitride. In a preferably embodiment, the barrier layer 150 may include aluminum gallium nitride ($Al_{x4}Ga_{1-x4}N$), and the carbon containing layer 560 includes carbon doped aluminum gallium nitride ($Al_{x5}Ga_{1-x5}N$), with all of $_{x3}$, $_{x4}$, $_{x5}$ being a constant greater than 0, and being between 0.1 and 0.5. In one embodiment, $_{x5}$ is greater than $_{x4}$ and $_{x4}$ is greater than $_{x3}$ ($_{x5}>_{x4}>_{x3}$), and in another embodiment, $_{x4}$ is greater than $_{x3}$ and $_{x4}$ is greater than $_{x5}$ ($_{x4}>_{x5}$, $_{x4}>_{x3}$), or $_{x3}$ is greater than $_{x4}$ and $_{x4}$ is greater than $_{x5}$ ($_{x3}>_{x4}>_{x5}$). (For example, the P-type III-V composition layer 570 (the second P-type III-V composition layer 570b) may include P-type aluminum gallium nitride ($Al_{0.1}Ga_{0.9}N$), the barrier layer 150 includes aluminum gallium nitride ($Al_{0.2}Ga_{0.8}N$), and the carbon containing layer 560 includes carbon doped aluminum gallium nitride ($C:Al_{0.3}Ga_{0.7}N$), but is not limited thereto. Furthermore, the thickness (thickness T2) and other features of the carbon containing layer 560 are substantially similar to those of the carbon containing layer 260 or the carbon containing layer 460, and will not be redundantly described hereinafter.

In the high electron mobility transistor 500, 600 of the present embodiment, although the P-type III-V composition layer 570 includes a multilayer structure, the carbon containing layer 560 is also disposed between the P-type III-V composition layer 570 and the channel layer 130 to function like an out diffusion barrier to prevent from the divalent dopant within the P-type III-V composition layer 570 diffusing into the channel layer 130 underneath during the annealing process. Also, the carbon containing layer 560 of the present embodiment is disposed at a relative deeper position for blocking any possible dopant diffused downwardly.

Figure 9:
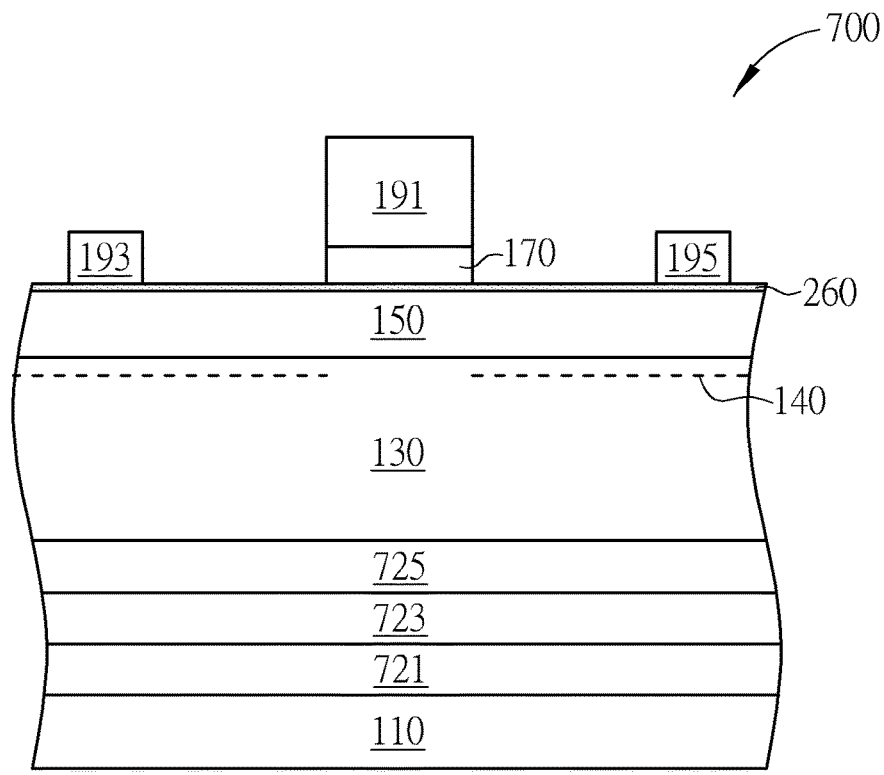
FIG. 9 is a schematic diagram illustrating a cross-sectional view of a high electron mobility transistor according to another embodiment in the present invention.

Please refer to FIG. 9, which illustrates a cross-sectional view of a high electron mobility transistor 700 according to another embodiment of the present invention. The structure of the high electron mobility transistor 700 is substantially similar to that in the aforementioned embodiment as shown in FIG. 2, and the similarity therebetween will not be redundant described hereinafter. The difference between the present embodiment and the aforementioned embodiment is mainly in that a nuclear layer 721, a transition layer 723 and a superlattice layer 725 are sequentially formed on the substrate 100 from bottom to top, under the channel layer 130.

Precisely, the nuclear layer 721, the transition layer 723 and the superlattice layer 725 are all functioned like a buffer layer to compensating the lattice structure and/or the mismatch of the thermal expansion coefficient between the substrate 100 and the aforementioned stacked layers (including the channel layer 130, the barrier layer 150 and the P-type III-V composition layer 170), so as to provide a better basis for the epitaxial process. The nuclear layer 721, the transition layer 723 and the superlattice layer 725 may respectively include a III-V compound such as aluminum nitride or aluminum gallium nitride. In one embodiment, the nuclear layer 721, the transition layer 723 and the superlattice layer 725 may optionally include a P-type dopant to capture the electrons diffused from the substrate 100 to avoid affecting the two-dimensional electron gas 140.

In the present embodiment, the nuclear layer 721 includes but not limited to aluminum nitride, and the lattice structure of the nuclear layer 721 may be gradually changed, so as to facilitate the gradually transformation of the lattice structure and/or the mismatch of the thermal expansion coefficient between the substrate 100 and the aforementioned stacked layers. For example, in one embodiment, the nuclear layer 721 may include a multilayer structure or gradient distributed aluminum gallium nitride ($Al_xGa_{1-x}N$) with $_x$ being a constant greater than or equal to 0, and less than 1, and with $_x$ being gradually decreased from bottom to top. The transition layer 723 may include aluminum gallium nitride ($Al_xGa_{1-x}N$, with $_x$ being a constant greater than or equal to 0, and less than 1), and the superlattice layer 725 include aluminum gallium nitride and aluminum nitride stacked on one over another, wherein the doping ratio of aluminum within aluminum gallium nitride of the transition layer 723 and aluminum gallium nitride of the superlattice layer 725 may be different from each other. The superlattice layer 725 may eliminates stresses of the stacked structure in a vertical direction by using a horizontal strain thereof, so as to avoid any possible defects like dislocations or fractures to affect the quality of the high electron mobility transistor 700.

Through these arrangements, the high electron mobility transistor 700 of the present embodiment may gradually improve the compatibility of the lattice structure and the thermal expansion coefficient between the substrate 100 and the stacked layers disposed thereon by using the additional disposed buffer layer including the nuclear layer 721, the transition layer 723 and the superlattice layer 725, to improve the possible defects to enhance the electrical property of the high electron mobility transistor 700.

Figure 10:
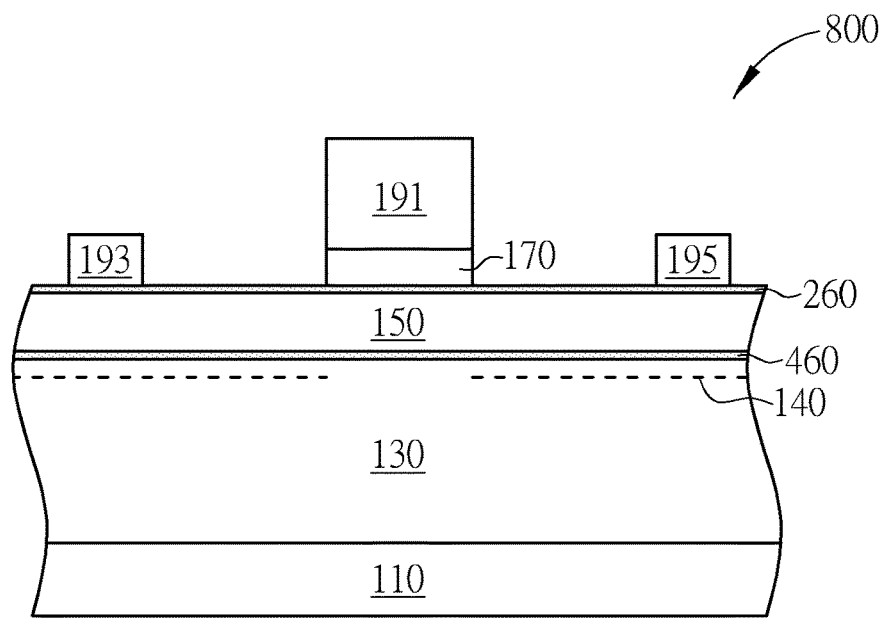
FIG. 10 is a schematic diagram illustrating a cross-sectional view of a high electron mobility transistor according to another embodiment in the present invention.

Please refer to FIG. 10, which illustrates a cross-sectional view of a high electron mobility transistor 800 according to another embodiment of the present invention. The structure of the high electron mobility transistor 800 is substantially similar to that of the aforementioned embodiments, and the similarity therebetween will not be redundant described hereinafter. The difference between the present embodiment and the aforementioned embodiment is mainly in that more than one carbon containing layer is disposed on the barrier layer 150 and under the barrier layer 150 respectively.

Precisely speaking, the carbon containing layer 260 and the carbon containing layer 460 of the aforementioned embodiments are both disposed in the high electron mobility transistor 800 of the present embodiment, with the carbon containing layer 260 being disposed between the P-type III-V composition layer 170 and the barrier layer 150, and with the carbon containing layer 460 being disposed between the barrier layer 150 and the channel layer 130, as shown in FIG. 10. The carbon containing layers 260, 460 may also include any suitable material containing carbon elements or doped with carbon atoms, for example silicon carbide or carbon doped III-V compounds. The materials of the carbon containing layer 260 and the carbon containing layer 460 may be optionally the same or different from each other. For example, in one embodiment, the carbon containing layer 260 may include carbon doped aluminum gallium nitride (C: $Al_{x3}Ga_{1-x3}N$), the barrier layer 150 may include aluminum gallium nitride ($Al_{x4}Ga_{1-x4}N$), and the carbon containing layer 460 includes carbon doped aluminum gallium nitride ($Al_{x5}Ga_{1-x5}N$), with all of $_{x3}$, $_{x4}$, $_{x5}$ being a constant greater than 0, and being between 0.1 and 0.5, and with $_{x5}$ being greater than $_{x4}$ and $_{x4}$ being greater than $_{x3}$ ($_{x5}>_{x4}>_{x3}$). In another embodiment, $_{x4}$ is greater than $_{x3}$ and $_{x4}$ is greater than $_{x5}$ ($_{x4}>_{x5}$, $_{x4}>_{x3}$), or $_{x3}$ is greater than $_{x4}$ and x4 is greater than $_{x5}$ ($_{x3}>_{x4}>_{x5}$). Furthermore, the thickness or other features of the carbon containing layer 260 and the carbon containing layer 460 are substantially similar to those of the aforementioned embodiment, and will not be redundantly described hereinafter.

Though these arrangements, the carbon containing layers 260, 460 of the present embodiment may both function like an out diffusion barrier to prevent from the divalent dopant within the P-type III-V composition layer 170 diffusing into the barrier layer 150 and/or the channel layer 130 underneath during the annealing process. In this way, the high electron mobility transistor 800 may obtain better barrier function, so as to improve the electrical property of the high electron mobility transistor 800. People well known in the arts should easily realize that the positions (such as being above or under the barrier layer 150) or the number (such as two) of the carbon containing layer are not limited thereto, and may be further adjusted based on the practical requirements, so as to form the out diffusion barriers in any suitable depth in any practical example.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a substrate;
   a P-type III-V composition layer disposed on the substrate;
   a gate electrode disposed on the P-type III-V composition layer, wherein the P-type III-V composition layer directly contacts the gate electrode;
   a channel layer, disposed on the substrate and comprising two-dimensional electron gas (2DEG) therein;
   a carbon containing layer disposed under the P-type III-V composition layer, wherein the carbon containing layer comprises silicon carbide, or carbon doped III-V compound, wherein the carbon containing layer is disposed between the P-type III-V composition layer and the channel layer, the P-type III-V composition layer comprises a first thickness and the carbon containing layer comprises a second thickness, and the second thickness is $\frac{1}{10} \sim \frac{1}{100}$ of the first thickness, wherein the P-type III-V composition layer comprises a multilayer structure, the multilayer structure comprises a first P-type III-V composition layer and a second P-type III-V composition layer stacked from top to bottom, and a material of the first P-type III-V composition layer is different from a material of the second P-type III-V composition layer; and
   a source electrode and a drain electrode disposed on the carbon containing layer, at two sides of the gate electrode.

2. The high electron mobility transistor according to claim 1, wherein a dopant concentration of carbon in the carbon containing layer is 1E15-1E21/cm$^3$.

3. The high electron mobility transistor according to claim 1, wherein the carbon doped III-V compound comprises carbon doped gallium nitride (C:GaN), carbon doped aluminum gallium nitride (C:AlGaN), or carbon doped boron nitride (C:BN).

4. The high electron mobility transistor according to claim 1, wherein the P-type III-V composition layer comprises a divalent dopant.

5. The high electron mobility transistor according to claim 4, wherein the divalent dopant comprises magnesium (Mg), zinc (Zn), calcium (Ca), beryllium (Be) or iron (Fe).

6. The high electron mobility transistor according to claim 1, further comprising:
   a barrier layer disposed between the P-type III-V composition layer and the channel layer, and the barrier layer is disposed under the carbon containing layer or on the carbon containing layer.

7. The high electron mobility transistor according to claim 6, wherein the barrier layer comprises $Al_{x1}Ga_{1-x1}N$, and the $_{x1}$ is a constant greater than 0 and less than 1.

8. A method of forming a high electron mobility transistor, comprising:
   providing a substrate;
   forming a P-type III-V composition layer on the substrate;

forming a gate electrode on the P-type III-V composition layer, wherein the P-type III-V composition layer directly contacts the gate electrode;

forming a channel layer on the substrate, the channel layer comprising two-dimensional electron gas (2DEG) therein;

forming a carbon containing layer under the P-type III-V composition layer, wherein the carbon containing layer comprises silicon carbide, or carbon doped III-V compound, wherein the carbon containing layer is disposed between the P-type III-V composition layer and the channel layer, the P-type III-V composition layer comprises a first thickness and the carbon containing layer comprises a second thickness, and the second thickness is $1/10 \sim 1/100$ of the first thickness, wherein the P-type III-V composition layer comprises a multilayer structure, the multilayer structure comprises a first P-type III-V composition layer and a second P-type III-V composition layer stacked from top to bottom, and a material of the first P-type III-V composition layer is different from a material of the second P-type III-V composition layer; and forming a source electrode and a drain electrode on the carbon containing layer, at two sides of the gate electrode.

\* \* \* \* \*